United States Patent [19]
Sinclair

[11] Patent Number: 5,730,606
[45] Date of Patent: Mar. 24, 1998

[54] UNIVERSAL PRODUCTION BALL GRID ARRAY SOCKET

[75] Inventor: William Y. Sinclair, Frenchtown, N.J.

[73] Assignee: Aries Electronics, Inc., Frenchtown, N.J.

[21] Appl. No.: 626,320

[22] Filed: Apr. 2, 1996

[51] Int. Cl.[6] .................................................. H01R 9/09
[52] U.S. Cl. ........................... 439/70; 439/857; 439/751
[58] Field of Search ................................ 439/851, 856, 439/857, 751, 70, 71

[56] References Cited

U.S. PATENT DOCUMENTS

| | | | |
|---|---|---|---|
| 4,359,258 | 11/1982 | Palecek et al. | 439/851 |
| 5,076,794 | 12/1991 | Ganthier | 439/70 |
| 5,392,980 | 2/1995 | Swamy et al. | 228/119 |
| 5,400,950 | 3/1995 | Myers et al. | 228/180 |
| 5,497,545 | 3/1996 | Watanabe et al. | 29/830 |
| 5,499,447 | 3/1996 | Murakami | 29/852 |
| 5,499,668 | 3/1996 | Katayama et al. | 134/1 |
| 5,562,462 | 10/1996 | Matsuba et al. | 439/70 |

OTHER PUBLICATIONS

1996 Advanced Interconnections Corporation—Hard Ball Grid Array Socketing System New Hard Ball BGA Sockets.

*Primary Examiner*—Neil Abrams
*Assistant Examiner*—T. C. Patel
*Attorney, Agent, or Firm*—Anthony J. Casella; Gerald E. Hespos; Ludomir A. Budzyn

[57] ABSTRACT

A universal production ball grid array socket is provided for use with a ball grid array package. The socket will receive a ball grid array package and in turn can be mounted or plugged into an underlying circuit board. One embodiment of the socket includes a tulip-shaped contact which is capable of receiving ball grid array ball leads of various diameters. Another embodiment of the socket includes a ball receiving contact capable of clasping an inserted ball grid array ball lead. In still another embodiment the universal production ball grid array socket is translucent allowing for visual inspection of a ball grid array package and ball grid array socket combination. Methods are provided for mounting a plurality of ball leads onto the bases of a plurality of ball receiving contacts after the contacts have been mounted within the universal production ball grid array socket.

6 Claims, 6 Drawing Sheets

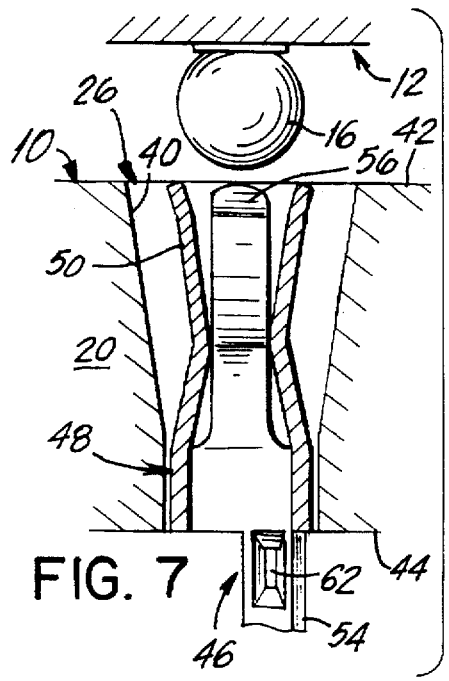
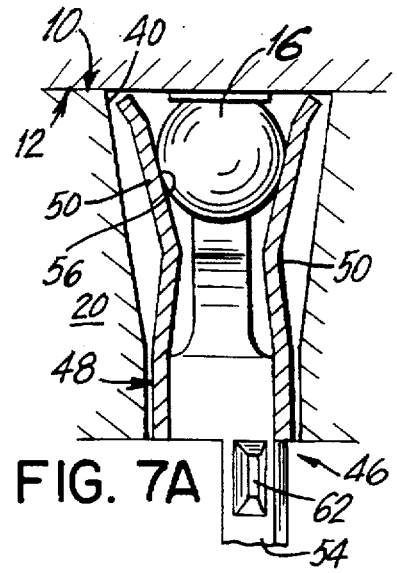
FIG. 7    FIG. 7A
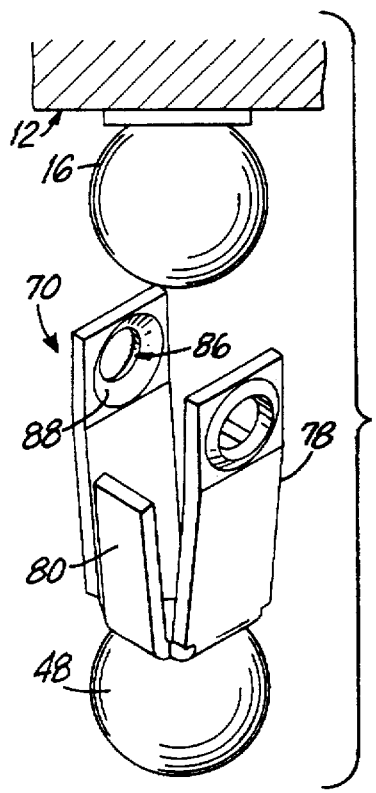
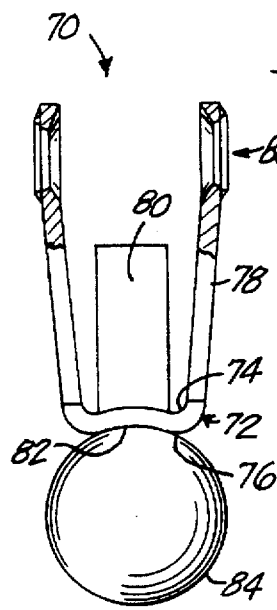
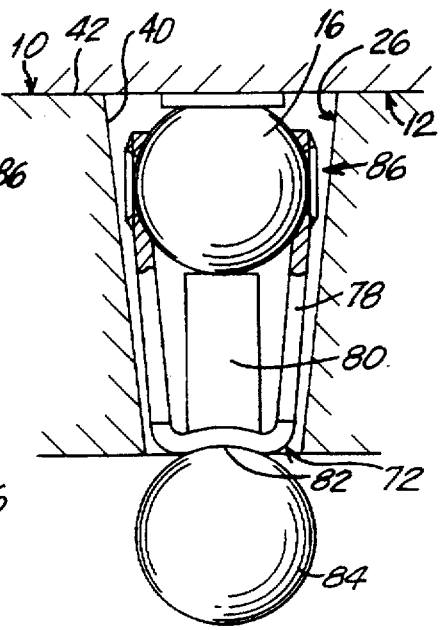
FIG. 8    FIG. 9    FIG. 10

UNIVERSAL PRODUCTION BALL GRID ARRAY SOCKET

BACKGROUND OF THE INVENTION

The subject invention relates to a universal production ball grid array socket for establishing solderless connections between the conductive balls of a ball grid array package and a printed circuit board. More particularly, the lead balls of a ball grid array package can be solderlessly mounted within the contacts of the ball grid array socket.

There currently exists several different methods for packaging semi-conductor devices. One popular type of semi-conductor packaging is referred to as a quad flat pack (QFP), which is a type of peripheral lead package. A new type of packaging technology is referred to as the ball grid array (BGA). The ball grid array was introduced by International Business Machines Corp. (IBM) and includes a number of benefits including small package size, good yield, better electrical performance, and lower profiles, among others.

The BGAs generally place conductive ball leads over entire surface of a chip, instead of just around the edges. Thus, BGA packages allow system designers to place more leads in a given package size using looser tolerances than peripheral lead type packages such as the quad flat pack. Therefore, board producers are not required to use the fine pitch spacings that are now necessary for high lead count packages. Also, BGAs have finer pitch spacings than pin grid arrays (PGA), since the solder balls do not have the coplanarality problem associated with through-hole PGAs. In the prior art, the electrical connection between the BGA package and underlying PC board was generally provided by soldering the ball leads which are located underneath the BGA package onto pads which are provided on the upper surface of printed circuit boards.

In many applications the soldering of the ball leads of the ball grid array package to the printed circuit board is undesirable. For example, it is impossible to visually locate a short or ground between the ball grid array package and printed circuit board. Usually, an expensive X-ray technique is required to inspect the connections since the ball leads are hidden under the ball grid array package. Further, the increasing number of ball leads being provided by ball grid array packages makes the soldering of the ball grid array packages to printed circuit boards more difficult.

Accordingly, in the prior art, an improved connector has been developed which is designed to eliminate the need for the soldering the ball leads of a BGA package to a printed circuit board. One example of a device which satisfied this criteria is the fuzz ball socket. The fuzz ball socket comprises a plurality of electrical contacts mounted within an insulated housing. Each contact resembles a brillo pad, made up of individual gold plated wires, forced into a through hole of the insulated housing. Using a great deal of pressure the fuzz ball socket can be forced down and bolted onto a PC board, thereby providing the proper electrical contact. The BGA package is then placed in the fuzz ball socket, a metal cover is placed on top of the BGA package and a great deal of pressure is exerted on the cover to force the ball leads of the BGA package into the proper electrical connection with the fuzz ball socket.

In many applications, the necessity of using a great deal of pressure to force the ball leads of a BGA package into a fuzz ball socket is undesirable. For example, the number of ball leads placed on a BGA package are increasing, thereby making the mounting of a BGA package within a fuzz ball socket increasingly difficult since greater and greater pressure is required to create a proper electrical connection. Further, the great force required to push the ball leads into contact with the fuzz ball socket creates wear on the BGA ball leads and increases the likelihood of distorting the ball leads. Additionally, the manufacture of a fuzz ball is very expensive since wire must be individually wired into each through hole.

It is therefore an object of the subject invention to provide a universal production ball grid array socket which eliminates the necessity to solder the conductive ball leads of a BGA package to the contacts of a printed circuit board.

It is another object of the subject invention to provide a universal production ball grid array socket which reduces the large amount of pressure required to mount a BGA package onto a BGA socket.

It is still another object of the subject invention to provide a universal production ball grid array socket having a unique resilient electrical contact capable of achieving electrical connection between the contact of a circuit board and the conductive ball lead of a BGA package. In particular, a socket is disclosed having a contact which resiliently expands to electrically engage conductive ball leads of varying diameters.

It is a further object of the subject invention to provide a universal ball grid array socket wherein the ball grid array package is positively locked within the housing of the ball grid array socket thereby preventing the degradation of the electrical connection due to vibration or other disturbance.

It is an object of the second embodiment of the subject invention to provide a coverless universal ball grid array socket having resilient contacts for clasping the ball leads of a BGA package thereby establishing a relatively high retentive force and preventing the degradation of electrical connection due to vibration or other disturbance.

It is an object of the third embodiment of the subject invention to provide a coverless universal ball grid array socket having resilient contacts for clamping the ball leads of the ball grid array package where only a slight portion of the resilient contact is utilized as a means for preventing contact slippage within the universal ball grid array socket.

It is an object of the fourth embodiment of the subject invention to provide a coverless translucent ball grid array socket which allows for quick and easy inspection of a ball grid array package and ball grid array socket combination.

An additional object of the subject invention is to provide a method for mounting ball leads onto a ball grid array socket.

SUMMARY OF THE INVENTION

In accordance with these and many other objects, the subject invention provides for a universal production ball grid array socket assembly for receiving a ball grid array package having an array of conductive ball leads. The socket assembly includes a generally rectangular, non-conductive housing having a carrier base, a plurality of upstanding side walls, and a cover. The carrier base has an upper surface, a lower surface, and a plurality of apertures corresponding to the plurality of conductive ball leads of the ball grid array package. Each aperture extends through the carrier base and is defined by an inner surface. The side walls define an insert area in which the ball grid array package can be placed. The cover is for retaining the ball grid array package placed in the insert area and for forcing the ball grid array package into electrical contact with the ball grid array socket. A plurality of tulip-shaped conductive ball receiving contacts are provided with each ball receiving contact mounted within an aperture of the carrier base.

Each ball receiving contact includes a split collar having a plurality of upwardly extending resilient cantilevered leaves, a plurality of downwardly extending cantilevered tangs, and a downwardly extending cantilevered blade. The resilient cantilevered leaves of each ball receiving contact are for releasably receiving and electrically engaging a ball lead of an inserted ball grid array package. The cantilevered tangs of each ball receiving contact engage the inner surface of the aperture in an interference fit. The cantilevered blade of each ball receiving contact is for engagement with an underlying semi-conductor device.

In a second embodiment of the subject invention there is provided a coverless ball grid array socket assembly which clasps an inserted ball grid array package into position. In particular, the socket assembly includes a generally rectangular, non-conductive carrier base having a plurality of apertures. Each aperture is defined by an inner surface and extends through the carrier base. A plurality of conductive ball receiving contacts are provided with each contact being mounted within an aperture of the carrier base.

Each ball receiving contact includes a base plate having an upper surface and a lower surface, two opposing cantilevered resilient arms extending upwardly from the base plate and two opposing resilient tangs extending upwardly from the base plate for engaging the inner surface of the surrounding aperture in an interference fit. Each resilient cantilevered arm of the ball receiving contact has a clasping mechanism for clasping a ball lead of an inserted ball grid array package. By this arrangement, the ball lead of an inserted ball grid array package is retained by and electrically engaged with the ball receiving contact without use of a cover. A conductive ball lead may be mounted to the lower surface of the base plate of the ball receiving contact for connection to an underlying semi-conductor device.

In a third embodiment of the subject invention there is provided a coverless ball grid array socket assembly which clasps an inserted ball grid array package into position through a plurality of conductive resilient ball receiving contacts. In particular, the socket assembly includes a generally rectangular, non-conductive carrier base having a plurality of apertures. Each aperture is defined by an inner surface and extends through the carrier base. A plurality of conductive ball receiving contacts are provided with each contact being mounted within an aperture of the carrier base.

Each ball receiving contact includes a base plate having an upper surface and a lower surface, two opposing cantilevered resilient arms extending upwardly from the base plate and four resilient tabs projecting slightly above the upper surface of the base plate for engagement with the inner surface of the surrounding aperture in an interference fit. Each resilient cantilevered arm of the ball receiving contact has a clasping mechanism for clasping a ball lead of an inserted ball grid array package. By this arrangement, the ball lead of an inserted ball grid array package is retained by and electrically engaged with the ball receiving contact without use of a cover. A conductive ball lead may be mounted to the lower surface of the base plate for connection to an underlying semi-conductive device.

In a fourth embodiment of the subject invention there is provided a coverless translucent ball grid array socket assembly which clasps an inserted ball grid array package into position through a plurality of conductive resilient ball receiving contacts. In particular, the socket assembly includes a generally rectangular translucent non-conductive carrier base having an upper surface, a lower surface and a plurality of apertures. Each aperture extends through the carrier base and is defined by an inner surface. A plurality of conductive ball receiving contacts are provided with each contact being mounted to the lower surface of the carrier base and extending within an aperture of the carrier base.

Each ball receiving contact includes an elongated base plate having a top surface, a bottom surface, and a length which is greater than the diameter of the carrier base aperture. Portions of the top surface of the elongated base plate are mounted to the lower surface of the carrier base. The ball receiving contact further includes two opposing cantilevered resilient arms which extend upwardly from the elongated base and into an aperture of the carrier base. Each resilient cantilevered arm has a clasping mechanism for clasping a ball lead of an inserted ball grid array package. By this arrangement, the ball lead of an inserted ball grid array package is retained by and electrically engaged with the ball receiving contact without use of a cover. The ball receiving contact may further include a conductive ball lead mounted to the bottom surface of the elongated base plate for engagement with an underlying semi-conductor device.

A method for the subject invention is provided for mounting a plurality of ball leads onto a ball grid array socket comprising the steps of mounting a plurality of ball receiving contacts within a plurality of apertures of a carrier base, the carrier base having a bottom surface and each ball receiving contact mounted within a corresponding aperture such that the bottom surface of each ball receiving contact is flush with the bottom surface of the carrier base to create a contact grid having contact areas and non-contact areas; inverting the carrier base; and depositing a plurality of ball leads onto the inverted carrier base, each ball lead deposited on the bottom surface of each ball receiving contact in the contact grid.

In summary, there is provided a universal production ball grid array socket assembly having tulip-shaped ball receiving contacts which allow ball grid array packages having ball leads of varying diameters to be solderlessly mounted to an underlying circuit board.

In summary, the second embodiment of the subject invention provides a coverless universal ball grid array socket having ball receiving contacts which clasp the ball leads of the ball grid array package with a substantial retentive force.

In summary, the third embodiment of the subject invention provides a coverless universal production ball grid array socket having clasping ball receiving contacts which have four slightly projecting tabs for mounting the ball receiving contacts within the universal production ball grid array socket of the subject invention.

In summary, the fourth embodiment of the subject invention provides a translucent coverless ball grid array socket which allows for quick and easy inspection of a ball grid array package and a ball grid array socket combination.

In summary, a method for the subject invention is provided for mounting a plurality of ball leads onto a ball grid array socket.

Other objects of the invention will become apparent from the following description in connection with the accompanying drawings.

BRIEF DESCRIPTION OF THE DRAWINGS

FIG. 7 is an exploded side elevational view, partially in section, of a ball grid array lead disengaged from a tulip-shaped ball receiving contact of the first embodiment of the subject invention.

FIG. 7A is a side elevational view, partially in section, of a ball grid array lead engaged with a tulip-shaped ball receiving contact of the first embodiment of the subject invention.

FIG. 8 is an exploded perspective view of a ball grid array lead disengaged from a dual contact of the second embodiment of the subject invention.

FIG. 9 is a side elevational view of a dual contact of the second embodiment of the subject invention.

FIG. 10 is a side elevational view, partially in section, of a ball grid array lead engaged with a dual contact of the second embodiment of the subject invention.

DETAILED DESCRIPTION OF THE INVENTION

Figure 1:
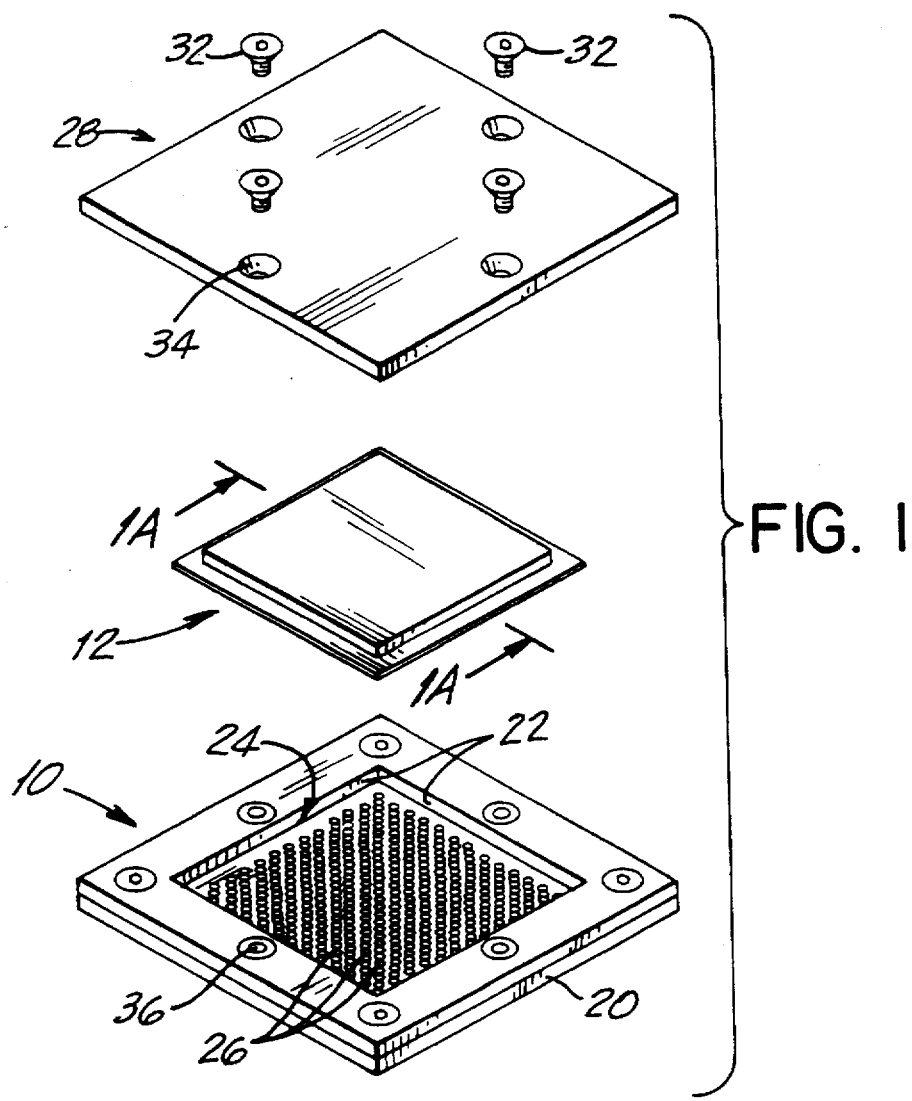
FIG. 1 is an exploded perspective view of the ball grid array socket of the subject invention.
Figure 1A:
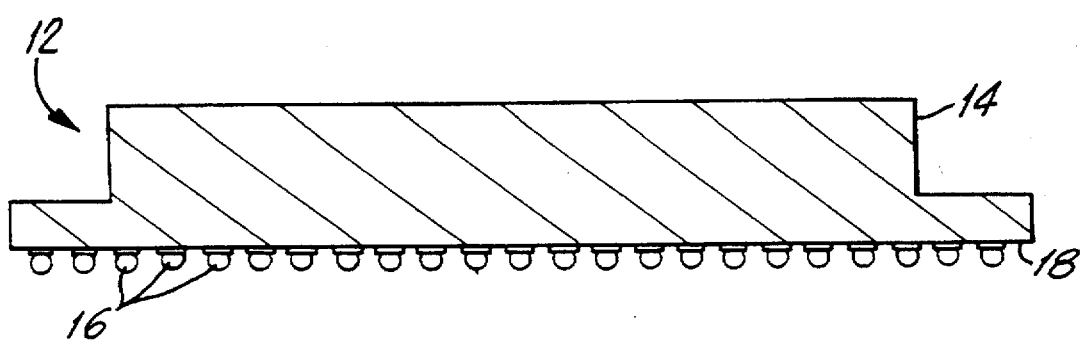
FIG. 1A is a side elevational view, partially in section, of a ball grid array package taken along line 1A—1A in FIG. 1.

Referring to FIGS. 1 and 1A, the present invention is indicated generally by the reference numeral 10. A ball grid array package 12 typically consists of a semi-conductor device 14 and a plurality of ball leads 16 extending downwardly from the bottom surface 18 of the semi-conductor device 14.

The present invention 10 includes a non-conductive base 20 and a plurality of walls 22 extending upwardly from the base 20. The base 20 and the plurality of walls 22 define an insert area 24 in which the ball grid array package 12 can be placed. A plurality of apertures 26 extend through the base 20 of the ball grid array socket 10. Additionally, the present invention includes a cover 28 which can be mounted to the upper surfaces 30 of the plurality of walls 22 through a plurality of screws 32. In particular, the plurality of screws 32 are screwed through a plurality of apertures 34 which extend through the cover and into a plurality of threaded holes 36 which extend into the plurality of walls 22.

As explained in further detail below, a ball grid array package 12 can be mounted to the ball grid array socket 10 of the subject invention by placing the ball grid array package 12 in the insert area 24 of the ball grid array socket 10. The cover 28 is then mounted on top of the ball grid array package 12 and ball grid array socket 10 combination by the plurality of screws 32.

Figure 2:
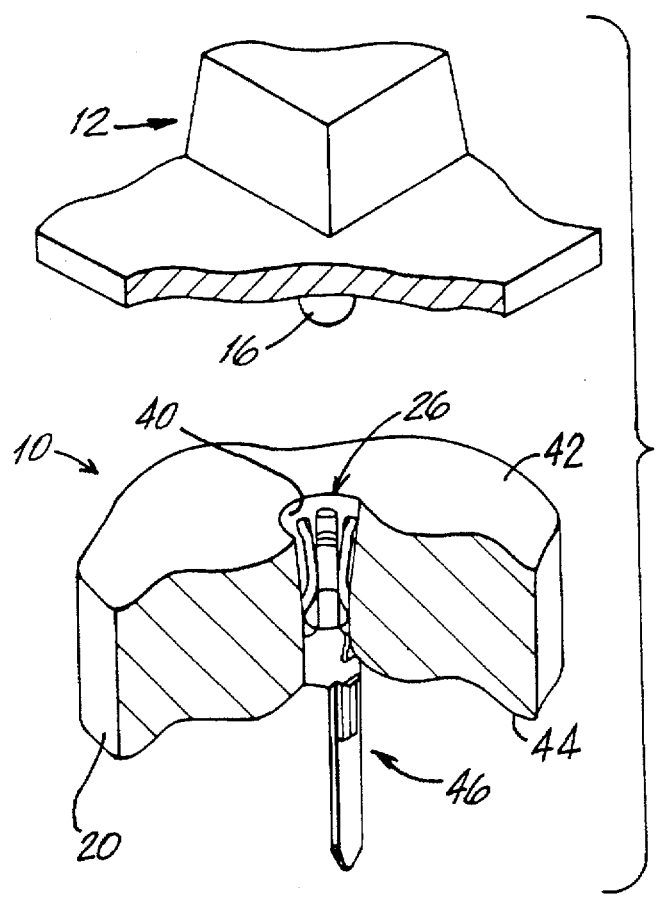
FIG. 2 is an exploded perspective view, partially in section, of a first embodiment of the subject invention.

Turning to FIG. 2, the cooperation between a ball lead 16 of the ball grid array 12 and an aperture 26 of the ball grid array socket 10 is shown in greater detail. The aperture 26 of the ball grid array socket 10 is tapered and is defined by an inner surface 40. The tapered aperture 26 has a maximum diameter adjacent the upper surface 42 of the base 20 and has a minimum diameter adjacent the lower surface 44 of the base 20. A tulip-shaped ball receiving contact 46 engages the inner surface of the tapered aperture 26 in an interference fit. As explained in further detail below, as each ball lead 16 of the ball grid array 12 enters its respective tapered aperture 26 in the ball grid array socket 10 the ball lead 16 engages the upper portion of the tulip-shaped ball receiving contact 46.

Turning to FIGS. 3–6, the tulip-shaped ball receiving contact 46 of the first embodiment of the subject invention is shown in greater detail. The tulip-shaped ball receiving contact 46 includes a split collar 48 from which a plurality of upwardly extending cantilevered leaves 50 extend. The tulip-shaped ball receiving contact 46 also includes a plurality of cantilevered tangs 52 and a single cantilevered blade 54 extending downwardly from the split collar 48. The tulip-shaped ball receiving contact 46 may be formed from any known resilient conductive material. One example being heat-treated beryllium copper.

Figure 6:
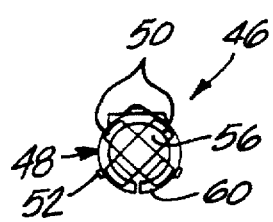
FIG. 6 is a top plan view of a tulip-shaped ball receiving contact of the first embodiment of the subject invention.
Figure 3:
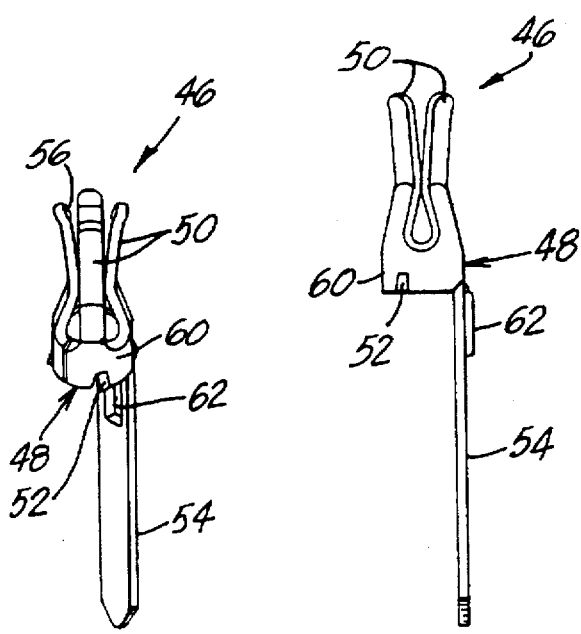
FIG. 3 is a perspective view of a tulip-shaped ball receiving contact of the first embodiment of the subject invention.
Figure 4:
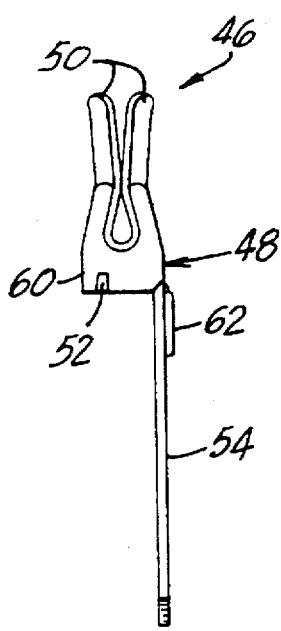
FIG. 4 is a side elevational view of a tulip-shaped ball receiving contact of the first embodiment of the subject invention.
Figure 5:
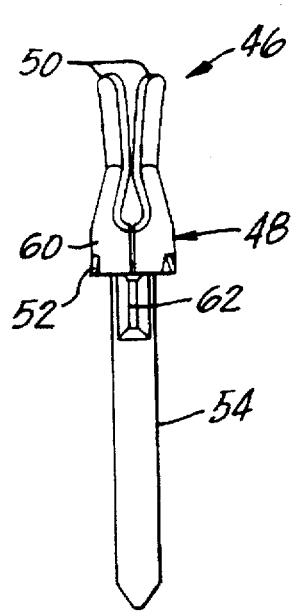
FIG. 5 is a front view of a tulip-shaped ball receiving contact of the first embodiment of the subject invention.

As seen in FIGS. 3 and 6, each leaf 50 of the tulip-shaped ball receiving contact 46 has a shallow V-shaped configuration with the apex of the V extending toward the center axis of the split collar 48. The upper inner portions 56 of each leaf 50 define the primary contact points between the tulip-shaped ball receiving contact 46 and an inserted ball lead 16 of a ball grid array package 12.

The plurality of tangs 52 extend downwardly from the split collar 48. Each tang extends beyond the outer surface 60 of the split collar 48. The tangs 52 become compressed when the tulip-shaped ball receiving contact 46 is inserted into the tapered aperture 26 of the base 20. This compression of the tangs 52 results in an interference fit between the tulip-shaped ball receiving contact 46 and the inner surface 40 of the tapered aperture 26. This interference fit prohibits shifting of the tulip-shaped ball receiving contact 46 during engagement and disengagement with a ball lead 16 of the ball grid array package 12.

The cantilevered blade 54 extends downwardly from the split collar 48 and includes a projection 62. This cantilevered blade 54 can be plugged into a socket of an underlying device or bent over and bolted to an underlying circuit board. Additionally, the blade 54 can be bent over and trimmed so that only the projection 62 is present. The projection 62 can then be soldered to an underlying electrical component.

Referring to FIGS. 7 and 7A, the ball grid array ball lead 16 and tulip-shaped ball receiving contact 46 combination is shown. In general, the ball lead 16 of the ball grid array package 12 and the ball receiving contact 46 move from a disengaged position where the ball grid array package 12 is inserted into the insert area 24 of the ball grid array socket 10 (FIG. 1) to an engaged position where the ball grid array package 12 is clamped into place by mounting the cover 28 onto the ball grid array package 12 and ball grid array socket 10 combination.

Turning to FIG. 7, the disengaged position of the tulip-shaped ball receiving contact 46 and the ball lead 16 is shown. At the disengaged position the ball lead 16 is spaced a distance from the tulip-shaped ball receiving contact 46. The resilient leaves 50 of the tulip-shaped ball receiving contact 46 are at rest and spaced apart at a distance less than the diameter of the ball lead 16 of the ball grid array package 12. The upper most portions of the cantilevered leaves 50 are flush with the upper surface 42 of the base 20. The cantilevered blade 54 of the tulip-shaped contact 46 projects below the lower surface 44 of the base 20 for engagement with an underlying electrical device.

Turning now to FIG. 7A, the engaged position of the tulip-shaped ball receiving contact 46 and the ball lead 16 is shown. In the engaged position the ball lead 16 engages the upper inner portions 56 of the cantilevered leaves 50 of the tulip-shaped ball receiving contact 46. In particular, the resilient leaves 50 bend away from the ball lead 16 that the tulip-shaped ball receiving contact 46 is receiving. Accordingly, the upper inner surface 56 of each leaf 50 wipes the ball lead 16 and engages in an electrical connection with the ball lead 16. As a result, a plurality of electrical connections of high integrity are created as the ball lead 16 is received within the plurality of leaves 50 of the tulip-shaped ball receiving contact 46. It should be noted that the leaves 50 never bend far enough so as to exceed the elastic limit of the material from which the tulip-shaped ball receiving contact 46 is made or bend far enough so as to come into contact with the inner surface 40 of the tapered aperture 26.

Turning to FIGS. 8–10, the second embodiment of the ball receiving contact of the subject invention is illustrated and is designated generally by the reference numeral 70. The dual contact 70 comprises a base 72 having an upper surface 74 and a lower surface 76. A pair of cantilevered resilient opposing arms 78 and a pair of cantilevered resilient opposing tangs 80 extend upwardly from the upper surface 74 of the base 72. The lower surface 76 of the base may be in the form of a well 82. A ball lead 84 may be soldered onto the lower surface 76 of the base 72 after the dual contact 70 has engaged the inner surface 40 of the tapered aperture 26 in a strong interference fit. The dual contact 70 may be formed from any known resilient conductive material. One example being heat-threaded beryllium copper.

As shown in FIG. 8, each resilient upwardly extending cantilevered arm 78 further includes a clasping mechanism. The preferred clasping mechanism is a tapered aperture 86 disposed adjacent the free end of the cantilevered arm 78.

The opposing pair of resilient tangs 80 are spaced apart at such a distance so as to ensure a strong interference fit between the dual contact 70 and the inner surface 40 of the tapered aperture 26. In particular, the dual contact 70 is inserted through the tapered aperture 38 adjacent the upper surface 42 of the base 20 of the ball grid array socket 10. The dual contact 70 is pressed into the aperture 26 until the base 72 of the dual contact 70 is flush with the lower surface 44 of the base 20 of the ball grid array socket 10. At this point the tangs 80 are engaged in an interference fit of sufficient strength with the inner surface 40 of the aperture 26 so as to ensure that the dual contact 70 remains in place as it engages and disengages a ball lead 16 of the ball grid array package 12. After the dual contact 70 engages the inner surface 40 of the tapered aperture 38 a ball lead 84 may be soldered onto the base 72 of the dual contact 70. The ball lead 84 may then be mounted to an underlying circuit board. The soldering of the ball lead 84 onto the base 72 of the dual contact 70 further strengthens the engagement of the dual contact lead 70 with the base 20 of the ball grid array socket 10 since the ball lead 84 is of a greater diameter than the minimum diameter of the tapered aperture 26 adjacent the lower surface 44 of the base 20. In other words, the ball lead 84 cannot be pulled through the tapered aperture 26 as the ball lead 16 is removed from the dual contact 70.

Referring to FIGS. 8 and 10, the disengaged and engaged positions of the ball grid array ball lead 16 and of the dual contact 70 are shown. In general, the ball lead 16 and dual contact 70 are in a disengaged position when the ball grid array package 12 is placed into the insert area 24 of the ball grid array 10 (see FIG. 1). The ball lead 16 and dual contact 70 are in an engaged position when a slight force is exerted on the ball grid array package 12 causing each dual contact 70 to clasp its respective ball lead 16.

Turning to FIG. 8, the disengaged position of the dual contact 70 and ball lead 16 is shown. In the disengaged position the ball lead 16 is spaced a distance from the dual contact 70. The pair of opposing resilient arms 78 of the dual contact 70 are at rest and spaced apart at a distance less than the diameter of the ball lead 16 of the ball grid array package 12.

Turning to FIG. 10, the engaged position of the dual contact 70 and ball lead 16 is shown. In the engaged position the ball lead 16 is clasped between each inner surface 88 of the clasping aperture 86. In going from the disengaged position to the engaged position the ball lead 16 initially causes the opposing arms 78 to resiliently expand away from each other as the ball lead 16 is inserted between them. However, when the ball lead 16 is pressed between each clasping aperture 86 the opposing arms 78 spring shut thus clasping the ball lead 16 between the inner surfaces 88 of the clasping aperture 86. It should be noted that the retentive force exerted by each dual contact 70 is significantly greater than the initial insertion force required to press a ball lead 16 into engagement with the dual contact 70. As a result, a ball grid array socket 10 employing the second embodiment of the ball receiving contact 70 does not require a cover to ensure proper engagement between the ball grid array package 12 and ball grid array socket 10.

Figure 11:
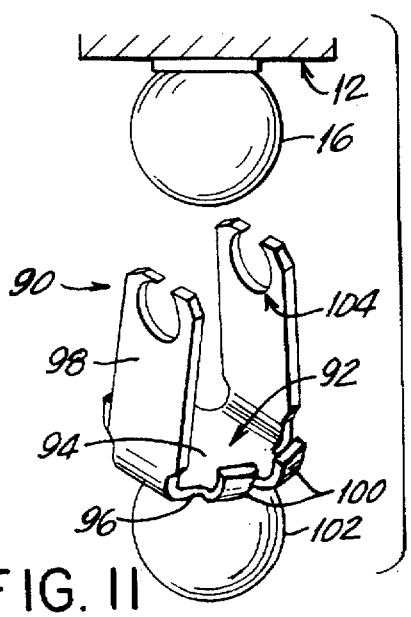
FIG. 11 is an exploded perspective view of a ball grid array lead disengaged from a ball receiving contact of the third embodiment of the subject invention.
Figure 12:
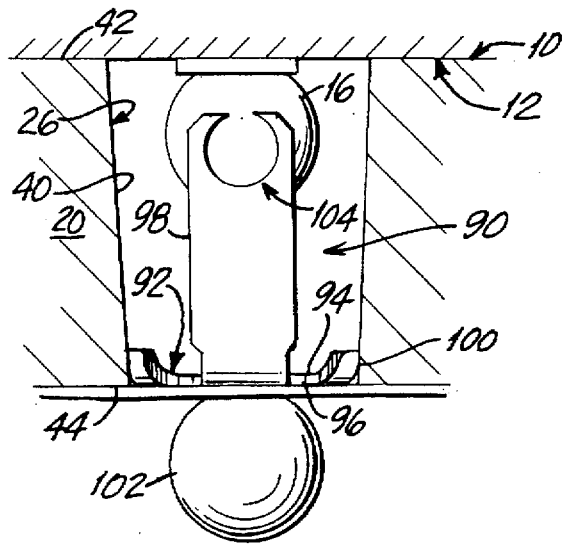
FIG. 12 is a side elevational view, partially in section, of a ball grid array lead engaged with a ball receiving contact of the third embodiment of the subject invention.

Turning to FIGS. 11–12, the third embodiment of the ball receiving contact of the subject invention is illustrated and is designated generally by the reference numeral 90. The ball receiving contact 90 comprises a base 92 having an upper surface 94 and a lower surface 96. A pair of cantilevered resilient opposing arms 98 extend upwardly from the upper surface 94 of the base 92. Two opposing pairs of tabs 100 project slightly from the upper surface 94 of the base 92. A ball lead 102 may be soldered onto the lower surface 96 of the base 92 after the ball receiving contact 90 has engaged the inner surface 40 of the tapered aperture 26 in a strong interference fit. The ball receiving contact 90 may be formed from any known resilient conductive material. One example being heat-treated beryllium copper.

As shown in FIG. 11, each resilient upwardly extending cantilevered arm 98 further includes a clasping mechanism. The preferred clasping mechanism for the third embodiment of the ball receiving contact is a bifurcated annular contact 104 disposed adjacent the free end of the cantilevered arm 98.

The opposing pairs of upwardly projecting tabs 100 are spaced apart at such a distance so as to ensure a strong interference fit between the ball receiving contact 90 and the inner surface 40 of the tapered aperture 26. In particular, the ball receiving contact 90 is inserted through the tapered aperture 26 at its maximum diameter, i.e., adjacent the upper surface 42 of the base 20 of the ball grid array socket 10. The ball receiving contact 90 is pressed into the aperture 26 until the contact base 92 is flush with the lower surface 44 of the base 20 of the ball grid array socket 10. At this point the opposing pairs of tabs 100 are engaged in an interference fit of sufficient strength so as to ensure that the ball receiving contact 90 remains in place as it engages and disengages a ball lead 16 of the ball grid array package 12. After the ball receiving contact 90 is engaged with the inner surface 40 of the aperture 26 in an interference fit a conductive lower ball lead 102 may be soldered onto the lower surface 96 of the base 92. The ball lead 102 may then be mounted to an underlying circuit board.

Referring again to FIGS. 11 and 12, the disengaged and engaged positions of the ball grid array ball lead 16 and the ball receiving contact 90 of the ball grid array socket 10 are shown. In general, the ball lead 16 and the ball receiving contact 90 are in a disengaged position when the ball grid array package 12 is first placed in the insert area 24 of the ball grid array socket 10 (see FIG. 1). The ball lead 16 and the ball lead receiving contact 90 are in an engaged position when a slight force is exerted on the ball grid array package 12 causing each ball lead receiving contact 90 to clasp its respective cooperating ball lead 16.

Referring to FIG. 11, the disengaged position of the ball receiving contact 90 and ball lead 16 is shown. In the disengaged position the ball lead 16 is spaced a distance from the ball receiving contact 90. The pair of opposing resilient arms 98 of the ball receiving contact 90 are at rest and spaced apart at a distance less than the diameter of the ball lead 16 of the ball grid array package 12.

Referring to FIG. 12, the engaged position of the ball receiving contact 90 and the ball lead 16 is shown. In the engaged position the ball lead 16 is clasped between the bifurcated annular contacts 104 of the resilient arms 98. In moving from the disengaged position to the engaged position the ball lead 16 initially causes the opposing arms 98 to resiliently expand away from each other as the ball lead 16 is inserted between them. However, when the ball lead is pressed between each bifurcated annular contact point 104 the opposing arms 98 spring towards each other thus clasping the ball lead 16 between the bifurcated annular contact points 104 of the opposing resilient arms 98. It should be noted that the retentive force exerted by each ball receiving contact 90 is significantly greater than the initial insertion force required to press a ball lead 16 into engagement with a ball receiving contact 90. As a result, a ball grid array socket 10 employing the third embodiment of the ball receiving contact 90 does not require a cover to ensure proper engagement between the ball grid array package 12 and ball grid array socket 10. Additionally, it should be noted that the tabs 100 of the third embodiment of the ball receiving contact 90 are manufactured from significantly less material than the tangs 80 of the second embodiment of the ball receiving contact 90. As a result, the third embodiment of the ball receiving contact 90 can be mass produced at a cost that is significantly less than the cost to mass produce the second embodiment of the ball receiving contact 90.

Figure 13:
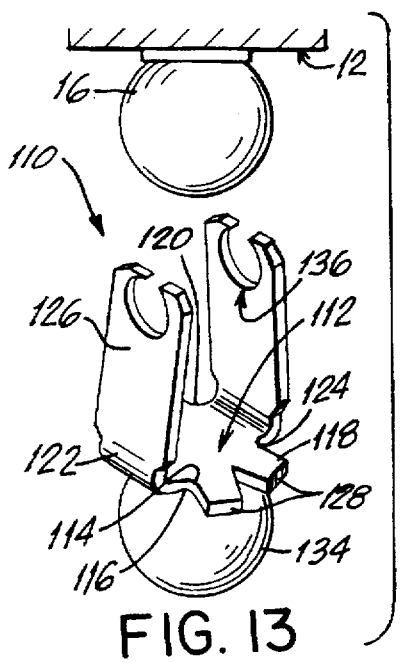
FIG. 13 is an exploded perspective view of a ball grid array lead disengaged from a ball receiving contact of the fourth embodiment of the subject invention.
Figure 14:
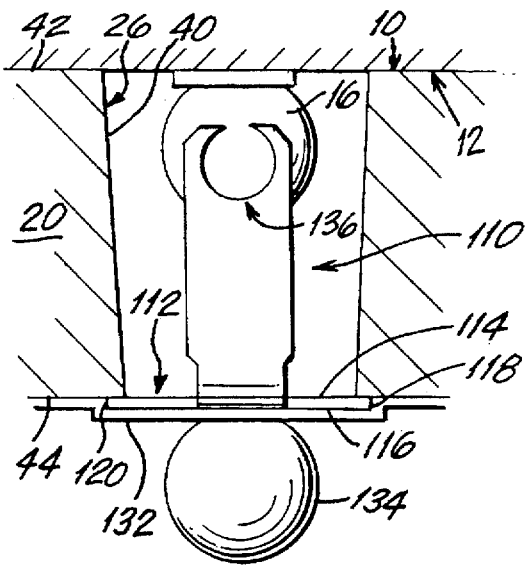
FIG. 14 is a side elevational view, partially in section, of a ball grid array lead engaged with a ball receiving contact of the fourth embodiment of the subject invention.
Figure 15:
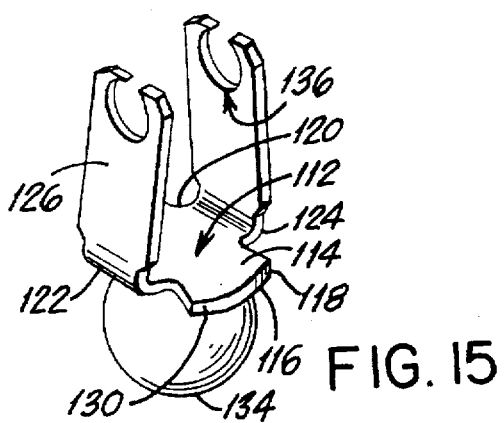
FIG. 15 is a perspective view of the ball receiving contact of the fourth embodiment of the subject invention with continuous front and rear edges.

Turning to FIGS. 13 and 14, the fourth embodiment of the ball receiving contact of the subject invention is illustrated and is designated by the reference numeral 110. The ball lead receiving contact 110 comprises an elongated base 112 having an upper surface 114, a lower surface 116, a front edge 118, a rear edge 120 and opposing side edges 122, 124. A cantilevered resilient arm 126 extends upwardly from each side edge 122, 124. The front and rear edges 118, 120 may have a plurality of annular projections 128, FIG. 13, or may be a continuous arc 130, FIG. 15. As seen in FIG. 14, the distance between the front edge 118 and the rear edge 120 is greater than the minimum diameter of the aperture 26. Accordingly, the ball receiving contact 110 does not engage in an interference fit with the aperture 26 that it is inserted within. A dry film 132 is used to connect the elongated base 112 to the lower surface 44 of the base 20 of the ball grid array socket 10. As a result, there is no pressure put on the inner surface 40 of the apertures 26. This is a critical aspect of this fourth embodiment of the ball receiving contact 110 because it allows the carrier base 20 of the subject invention to be manufactured from a translucent material containing a high percentage of glass. In particular, the lack of internal pressure caused by the lack of the friction fittings in the apertures 26 is critical because pressure caused by friction fittings would shatter a carrier base 20 formed from a translucent material. A ball lead 134 may be soldered onto to the lower surface 116 of the base 112 of the ball receiving contact 110 after the ball receiving contact 110 has been connected by the dry film 132 to the lower surface 44 of the carrier base 20.

As shown in FIG. 13, each resilient upwardly extending cantilevered arm 126 further includes a clasping mechanism. The preferred clasping mechanism for the fourth embodiment of the ball receiving contact 110 is a bifurcated annular contact point 136 disposed adjacent the free end of the cantilevered arm 126.

Referring to FIGS. 13 and 14, the disengaged and engaged positions of the ball grid array ball lead 16 and of the ball receiving contact 110 are shown. In general, the ball lead 16 and ball receiving contact 110 are in a disengaged position when the ball grid array package 12 is first placed into the insert area 24 (see FIG. 1) of the ball grid array socket 10. The ball lead 16 and ball receiving contact 110 enter into an engaged position when a slight force is exerted on the ball grid array package 12 causing each ball receiving contact 110 to clasp its respective cooperating ball lead 16.

Turning to FIG. 14, the disengaged position of the ball receiving contact 110 and ball lead 16 is shown. In the disengaged position the ball lead 16 is spaced a distance from the ball receiving contact 110. The pair of opposing resilient arms 126 of the ball lead receiving contact 110 are at rest and spaced apart at a distance less than the diameter of the ball lead 16 of the ball grid array package 12.

Turning to FIG. 14, the engaged position of the ball receiving contact 110 and ball lead 16 is shown. In the engaged position the ball lead 16 is clasped between the bifurcated annular contacts 136 of the resilient arms 126. In moving from the disengaged position to the engaged position the ball lead 16 initially causes the opposing arms 126 to resiliently expand away from each other as the ball lead 16 is inserted between them. However, when the ball lead 16 is pressed between each bifurcated annular contact point 136 the opposing arms 126 spring back towards each other thus clasping the ball lead 16 between their bifurcated annular contact points 136. It should be noted that the retentive force exerted by each ball receiving contact 110 is significantly greater than the initial insertion force required to press a ball lead 16 into engagement with the ball receiving contact 110. As a result, a ball grid array socket 10 employing the fourth embodiment of the ball receiving contact 110 does not require a cover to ensure proper electrical engagement between the ball grid array package 12 and ball grid array socket 10.

Figure 16A:
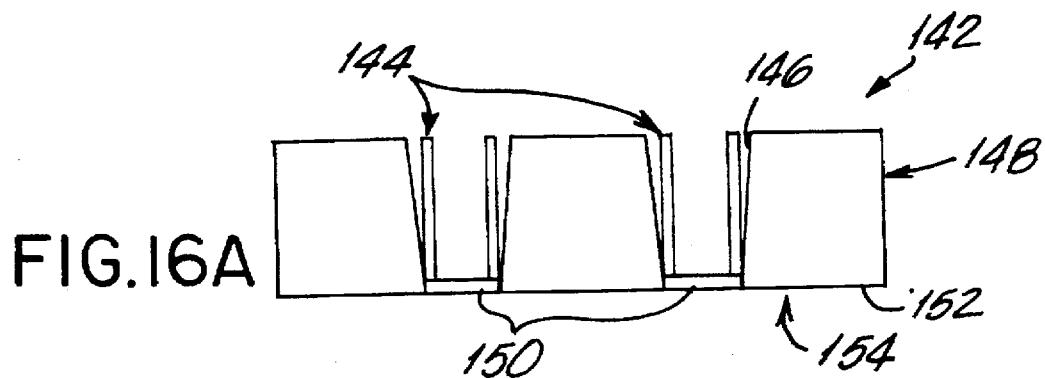
FIG. 16A–D illustrates a method of mounting ball leads to a ball grid array socket utilizing a solder resist.

Referring now to FIGS. 16A–16D, a method for mounting a plurality of ball leads 140 onto a ball grid array socket 142 is shown. Turning to FIG. 16A, a plurality of ball receiving contacts 144 are mounted within a plurality of corresponding apertures 146 which extend through the carrier base 148. When properly mounted, the base 150 of each ball receiving contact 144 is flush with the bottom surface 152 of the carrier base 148. As a result, a contact grid 154 is created having the base 150 of the ball receiving contacts 144 as contact areas and the non-conductive bottom surface 152 of the carrier base 148 as non-contact areas.

Figure 16B:
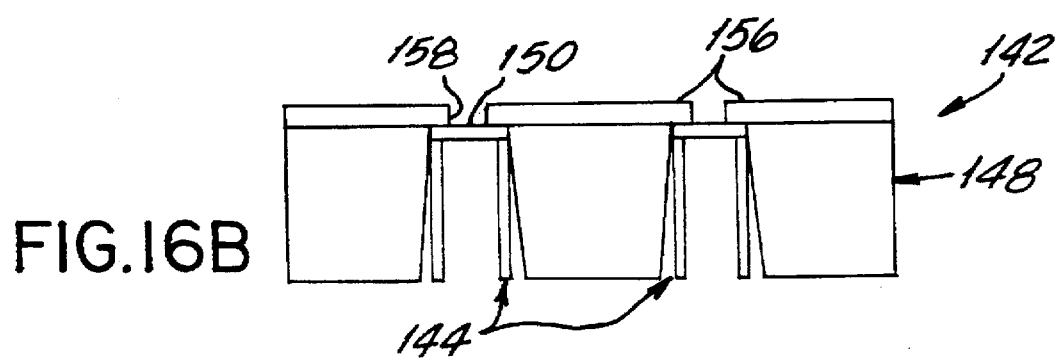

Turning to FIG. 16B, the steps of inverting the carrier base 148 and screening solder resist 156 onto the inverted carrier base 148 are shown. In particular, the carrier base 148 is inverted after the ball receiving contacts 144 have been mounted within the apertures 146 of the carrier base 148. Afterwards, a layer of solder resist 156 is screened onto the inverted carrier base 148 through a stencil (not shown). A plurality of apertures 158 remain after the solder resist screening step and leave a portion of each base 150 of each ball receiving contact 144 exposed.

Figure 16C:
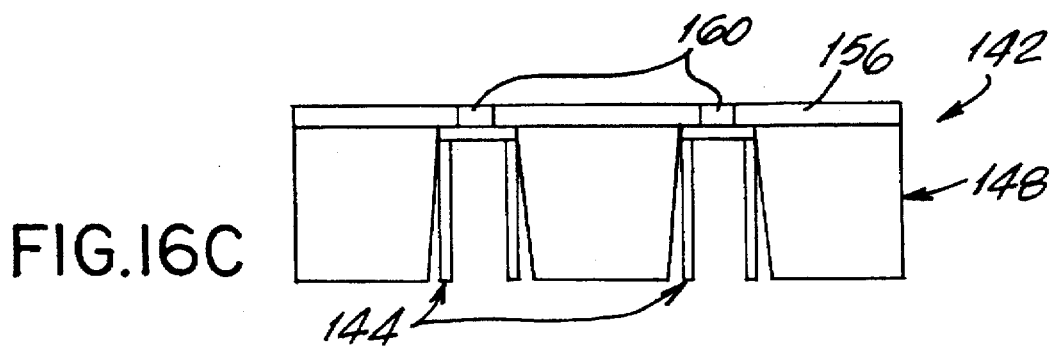

Turning to FIG. 16C, the step of screening a sticky flux 160 into the apertures 158 is shown. In particular, a sticky flux 160 is screened into the apertures 158 and onto the bases 150 of the ball receiving contacts 144 through a stencil (not shown).

Figure 16D:
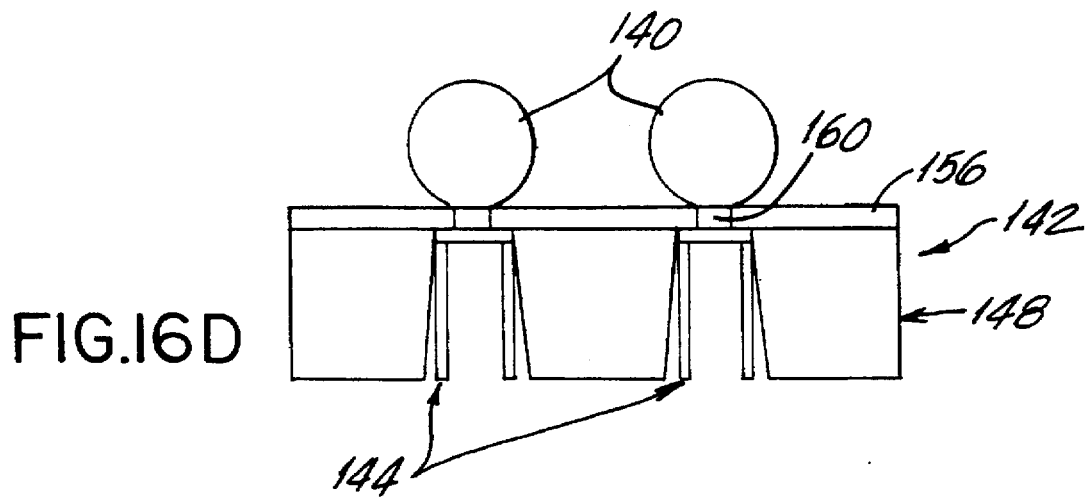

Turning to FIG. 16D, the step of depositing the ball leads 140 onto the base carrier 148 is shown. In particular, the ball leads 140 are deposited onto the plurality of sticky flux regions 160 covering the formerly exposed portions of the bases 148 of the ball receiving contacts 144. Afterwards, the inverted carrier 148 and eutectic solder ball leads 140 combination is heated to seal the ball leads 140 to the carrier base 148 through the solder resist 156 and electrically connect the ball leads 140 to the bases 150 of the ball receiving contacts 144 through the sticky flux 160.

Figure 17A:
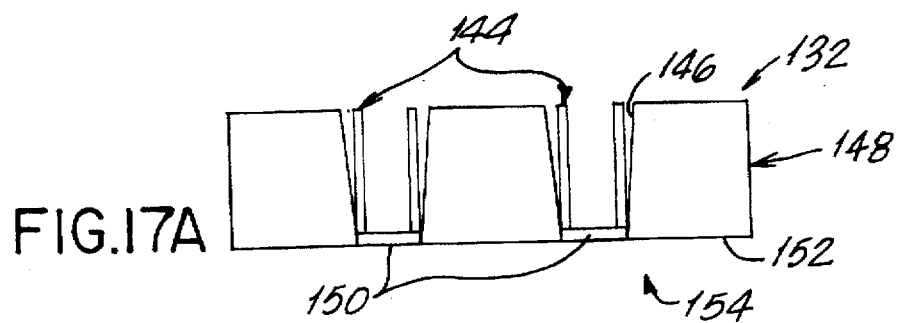
FIG. 17A–E illustrates a method of mounting ball leads to a ball grid array socket utilizing a dry resist.

Turning now to FIGS. 17A–17E, a second embodiment of the method for mounting a plurality of ball leads 140 onto a ball grid array socket 142 is shown. Turning to FIG. 17A, a plurality of ball receiving contacts 144 are mounted within the corresponding plurality of carrier base apertures 146 which extend through a carrier base 148. When properly mounted, each base 150 of each ball receiving contact 144 is flush with the bottom surface 152 of the carrier base 148. As a result, a contact grid 154 is created having the bases 150 of the plurality of ball receiving contacts 144 as contact areas and a non-conductive bottom surface 152 of the carrier base 148 as non-contact areas.

Figure 17B:
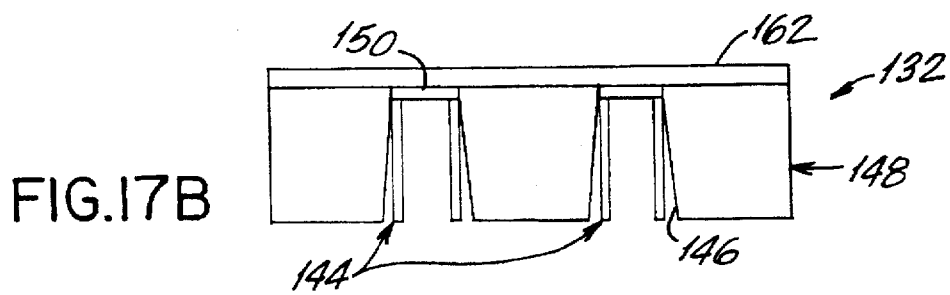

Turning to FIG. 17B, the steps of inverting the carrier base 148 and depositing a dry resist 162 are shown. In particular, the carrier base 148 is inverted after the ball receiving contacts 144 have been mounted within the apertures 146 of the carrier base 148. Afterwards, a layer of dry resist 162 is deposited over the inverted carrier base 148 and the bases 150 of the mounted ball receiving contacts 144.

Figure 17C:
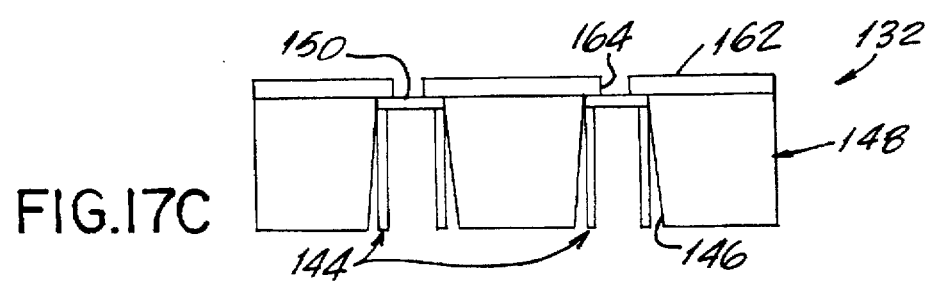

Turning to FIG. 17C, the step of etching the dry resist 162 is illustrated. In particular, apertures 158 are etched into the dry resist 156 above a portion of each base 150 of each ball receiving contact 144. As a result, a portion of each contact base 150 is exposed.

Figure 17D:
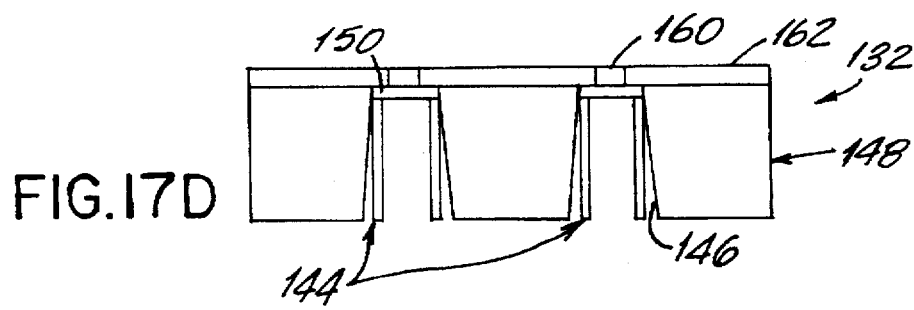

Turning to FIG. 17D, the step of screening a sticky flux 160 into the apertures 158 is shown. In particular, a sticky flux 160 is screened into the apertures 158 and onto the exposed portions of the bases 150 of the ball receiving contacts 144 through a stencil (not shown).

Figure 17E:
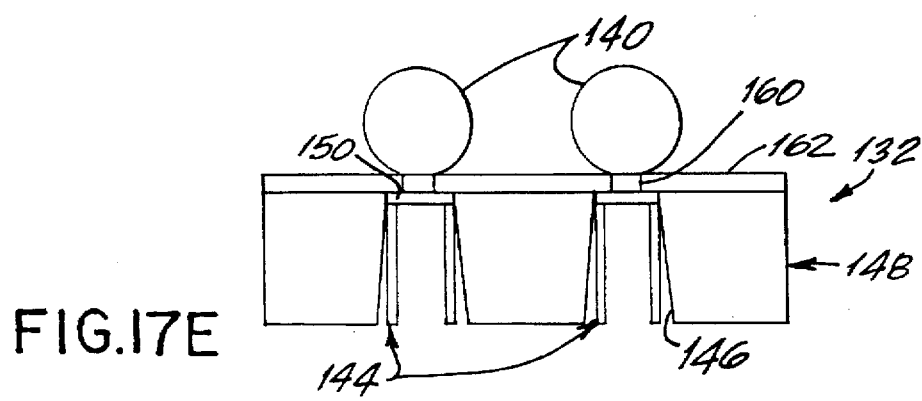

Turning to FIG. 17E, the step of depositing the ball leads 140 onto the carrier base 148 is shown. In particular, eutectic solder ball leads 140 are deposited onto the plurality of sticky flux regions 160 covering the formerly exposed portions of the bases 150 of the ball receiving contacts 144. Afterwards, the eutectic solder ball leads 140 and inverted carrier 148 combination are heated to seal the eutectic ball leads 140 to the carrier base 148 through the dry resist 162 and to electrically connect the ball leads 140 to the bases 150 of the ball receiving contact 144 through the sticky flux 160.

While the invention has been described with respect to several embodiments, it is apparent that a variety of changes may be made without departing from the scope of the invention as defined by the appended claims.

For example, in lieu of the tapered clasping aperture 86 of the second embodiment of the ball receiving contact 70 of the subject invention, an equivalent clasping mechanism such as a plurality of slits or a well may be provided. Additionally, in lieu of the dry film 132 utilized in the fourth embodiment of the ball receiving contact 110 of the subject invention, a solder resist may be provided. Furthermore, in lieu of the sticky flux 160 and eutectic solder ball leads 140 of the first and second embodiments of the method of the subject invention, solder paste and copper ball leads may be provided.

I claim:

1. A universal production ball grid array socket assembly for receiving a ball grid array package having a plurality of conductive ball leads, said socket assembly comprising:
  a generally rectangular non-conductive housing including:
    a carrier base having an upper surface, a lower surface, and a plurality of apertures corresponding to said plurality of conductive ball leads of said ball grid array package, each aperture extending through said carrier base and defined by an inner surface,
    a plurality of side walls, each side wall extending upwardly from said carrier base;
    a cover for forcing said ball grid array package into said housing, said cover having a locking means for interlocking with said side walls of said housing; and
  a plurality of conductive ball lead receiving contacts, each ball lead receiving contact having a tulip shape and mounted within an aperture of said carrier base, each tulip-shaped contact including:
    a split collar having an outer surface;
    a plurality of resilient cantilevered leaves extending upwardly from said split collar for receiving a conductive ball lead of said ball grid array package, said leaves spaced apart a distance less than the diameter of said conductive ball;
    a plurality of cantilevered tangs extending downwardly and radially from said split collar, each said cantilevered tang having a free end spaced from said outer surface of said collar, said free ends of said cantilevered tangs being in pressing engagement with said inner surface of said aperture such that said free ends generate an interference fit with said inner surface of said aperture; and a cantilevered blade extending downwardly from said split collar for engagement with an underlying electrical component.

2. The socket assembly of claim 1, wherein said apertures are tapered, each tapered aperture having a maximum diameter adjacent said upper surface of said carrier base and a minimum diameter adjacent said lower surface of said carrier base.

3. The socket assembly of claim 1, wherein said cantilevered leaves are generally V-shaped in configuration, each cantilevered leave having the apex of said V defining an intermediate projecting section.

4. The socket assembly of claim 1, wherein said tulip-shaped contact is heat-treated beryllium copper.

5. The socket assembly of claim 1, wherein said cantilevered leaves have free ends which are flush with said upper surface of said carrier base.

6. The socket assembly of claim 1, wherein said cantilevered blade projects below said lower surface of said carrier base.

* * * * *